United States Patent [19]

Urasaki et al.

[11] Patent Number: 5,403,672
[45] Date of Patent: Apr. 4, 1995

[54] METAL FOIL FOR PRINTED WIRING BOARD AND PRODUCTION THEREOF

[75] Inventors: Naoyuki Urasaki; Kouichi Tsuyama, both of Shimodate; Kiyoshi Hasegawa, Yuki; Shuichi Hatakeyama, Shimodate; Akinari Kida, Tochigi; Akishi Nakaso; Hiroshi Nomura, both of Oyama, all of Japan

[73] Assignee: Hitachi Chemical Co., Ltd., Tokyo, Japan

[21] Appl. No.: 59,658

[22] Filed: May 12, 1993

[30] Foreign Application Priority Data

Aug. 17, 1992 [JP] Japan .................................. 4-217815

[51] Int. Cl.6 .......................... B32B 15/20; B32B 3/30
[52] U.S. Cl. ..................................... 428/607; 428/612; 428/675; 428/687; 428/935
[58] Field of Search ............... 428/612, 675, 626, 607, 428/687, 935, 601; 205/111, 258, 182

[56] References Cited

U.S. PATENT DOCUMENTS

| | | | |
|---|---|---|---|
| 3,857,683 | 12/1974 | Castonguay | 428/626 |
| 3,998,601 | 12/1976 | Yates et al. | 428/607 |
| 4,088,544 | 5/1978 | Hotkin | 205/182 |
| 4,503,112 | 3/1985 | Konicek | 428/607 |
| 4,888,574 | 12/1989 | Rice et al. | 205/258 |
| 4,935,310 | 6/1990 | Nakatsugawa | 428/607 |
| 5,262,247 | 11/1993 | Kajiwara et al. | 428/607 |

FOREIGN PATENT DOCUMENTS 2073778A 10/1981 United Kingdom ............... 205/182

*Primary Examiner*—John Zimmerman
*Attorney, Agent, or Firm*—Antonelli, Terry, Stout & Kraus

[57] ABSTRACT

A metal foil for printed wiring boards comprising a first copper layer to be adhered to a resin, a second copper layer having a sufficient strength as a metal layer and a nickel-phosphorus alloy layer containing 1.1% by weight or more of phosphorus formed between the first and second copper layers is suitable for producing printed wiring boards having excellent heat resistance, particularly during production procedures.

10 Claims, 1 Drawing Sheet

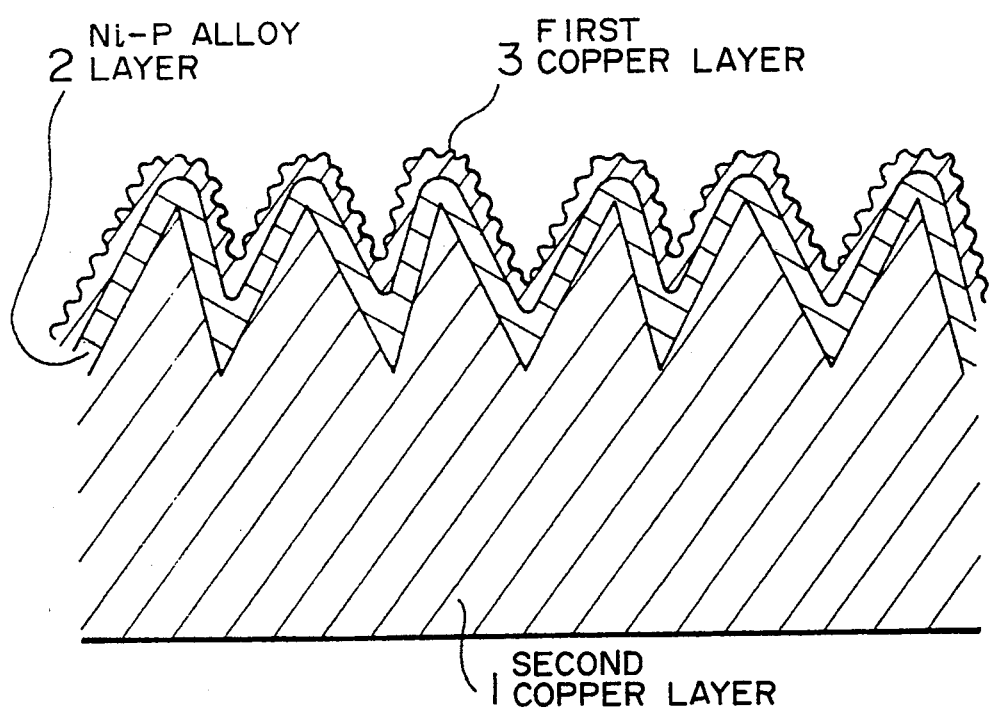

METAL FOIL FOR PRINTED WIRING BOARD AND PRODUCTION THEREOF

BACKGROUND OF THE INVENTION

The present invention relates to a metal foil used in a printed wiring board and a process for producing the same, and a process for producing a printed wiring board using said metal foil.

With the progress of electronic instruments, those having higher functions have been demanded. For example, as to the wiring density, so-called surface mounting parts which are connected to electronic parts only on a surface of wiring board have been developed. A distance of connecting terminal of the electronic part is shortened to 0.15 mm or less. In accordance with such a distance, the formation of circuit conductors for attaining such a density is demanded.

On the other hand, as to heat resistance, the heat resistance of 260° C. which temperature is necessary for soldering is, needless to say, necessary. Further, it is also required to have heat resistance sufficient to withstand under severe conditions of using circumstances, for example, used for controlling a car, or to withstand under bad circumstances of ship bottoms used for transporting products.

Printed wiring boards used for such purposes have been produced by a subtractive process wherein a copper clad laminate obtained by binding a copper foil on an insulating substrate is used as a starting material, and portions of the copper foil not becoming conductor circuits are removed by etching to form circuits, an additive process wherein conductor circuits are formed on an insulating substrate by electroless plating, a partial additive process wherein a part of circuit conductors at inner walls of through holes is formed by electroless plating, etc.

Among these processes, the subtractive process has been carried out for a long time wherein the enhancement of wiring density is usually conducted by thinning the thickness of copper foil used in copper-clad laminate. This is because when unnecessary copper foil protruded from an etching resist is removed by an etching solution after forming the etching resist in the form of necessary circuit on the copper foil surface, a phenomenon of so-called side etching wherein the copper is corroded from side faces of necessary circuit portions takes place. The thicker the copper foil becomes, the larger the removed copper amount from the side faces by the side etching becomes. Thus, the formation of fine circuits becomes difficult.

In addition, in the case of a printed wiring board wherein inner walls of through-holes are metallized to connect different layers of circuits, it is generally conducted to drill holes in a copper-clad laminate, to conduct electroless plating on the whole inner walls of holes and copper foil surfaces, and to conduct electric plating in order to secure the thickness of a metal layer on the inner walls of holes. Thus, the plating layer is formed on the copper foil, resulting in making the copper thickness naturally larger. Therefore, it is necessary to use a thin copper foil when used as the copper-clad laminate which is a starting material. As the thin copper foil, there are used a rolled copper foil obtained by rolling copper with heat and pressure, an electrolyzed copper foil obtained by depositing copper on a surface of metal such as stainless steel by electrolytic plating. The thickness of these foils are usually 18 to 70 $\mu$m.

Recently, it is also known that an electrolyzed copper foil can be obtained by forming a thin copper foil of about 5 $\mu$m thick on an aluminum foil by electrolytic plating.

But such a thin copper foil has problems in that when the copper foil is laminated with non-cured or semi-cured prepreg, handling is so difficult that the copper foil is easily folded by slight force, and such folding often takes place during the production of the copper foil depending on a way of handling. In order to prevent such folding, the thin copper foil is first laminated with a support to form a composite laminate having sufficient strength as a whole, followed by removal of the support after binding with a resin or immediately before the use.

Such a process is disclosed, for example, in U.S. Pat. Nos. 4,394,419 and 4,503,112. According to these U.S. Patents, there is disclosed a metallic foil including (a) a carrier layer of copper fully removable by etching and having a thickness of about 10–35 microns, (b) a thin layer of copper having a thickness in the range of 1–12 microns to be used in the formation of electrical circuit paths, and (c) an intermediate metallic layer positioned between the (a) and (b) layers and secured thereto, and having a thickness in the range of 0.1 to 2.0 microns. But, since the intermediate metallic layer is selected from the group consisting of nickel, a nickel-tin alloy, nickel-iron alloy, lead and a tin-lead alloy, there are many problems in that the intermediate layer is poor in selective etching properties of the carrier copper after heat treatment, some materials are poor in selective etching properties of intermediate layer, and other materials are poor in stability of plating solutions.

Since the selective etching properties of the carrier copper after heat treatment is poor, when the carrier copper is removed after adhesion of laminates, the intermediate layer is also removed sometimes depending on the temperature applied to the laminate adhesion between an insulating layer and such a copper foil.

Further, when a highly heat resistant prepreg such as a polyimide resin-impregnated prepreg or a highly heat resistant thermoplastic such as a fluorine resin is used as intermediate insulating layers in multi-layer wiring boards which are recently required to have high heat resistance, it is necessary to heat at near 400° C. for laminate adhesion. Under such severe conditions, the materials of prior art references lose the selective etching properties of carrier copper to carry out excessive etching, often resulting in damaging the intermediate layer.

As to the selective etching properties of intermediate layer, when a commercially available etching solution comprising ethylenediamine, sodium hydroxide and m-nitrobehzenesulfonic acid as main components is used, an intermediate layer made of nickel, a nickel-iron alloy, nickel-tin alloy or tin is either not etched or causes a so-called "smut" on the surface of intermediate layer. When the smut occurs, the surface of intermediate layer becomes a dull color with irregular light and shade different from a metallic color. Once the smut occurs, it is difficult to remove it and impossible to conduct plating thereon in the production of printed wiring boards. Thus, it is very disadvantageous industrially.

Further, the intermediate layer cannot be removed by only contacting with an etching solution of prior art, and can be removed anodically, i.e. by passing an electric current. But such an electrolytic etching requires a special apparatus, and brings about various problems such as consumption of electric power, maintenance of the apparatus, maintenance of good circumstances, and the like, so that it is not advantageous industrially.

In addition, in the case of a nickel-iron plating solution, there are problems in that the plating solution per se is not stable, nickel-iron plating is not advantageous industrially, and the like. The tin plated layer obtained by using an acidic tin plating solution can be formed as an intermediate layer, but when it is subjected to copper plating for forming circuit copper, it contaminates the copper plating solution. This is not advantageous industrially.

On the other hand, printed wiring boards are recently required to have both high wiring density and high heat resistance. In order to use a resin having high heat resistance, it is necessary to use materials which are not denatured at higher curing temperatures in the production of printed wiring boards since the curing temperature becomes very high. For example, when a high heat resistant polyimide resin is used together with the above-mentioned three-layered metal foil, the three-layered metal foil is also required to have high heat resistance during the production procedure due to a high temperature used for curing the high heat resistant resin. This heat resistance not only means that no physical changes such as deformation, shrinkage and expansion due to high temperatures take place but also requires that the intermediate layer among the three layers should not be denatured at high temperatures, and the copper layer used as the support should be removed easily. But according to known techniques heretofore developed, denaturing of the intermediate layer at high temperatures cannot be avoided and it is difficult to easily remove the composite layer.

SUMMARY OF THE INVENTION

It is an object of the present invention to provide a metal foil excellent in wiring density and heat resistance during production procedures, and a process for producing the same. It is another object of the present invention to provide a process for producing a printed wiring board easily using the metal foil mentioned above.

The present invention provides a metal foil for printed wiring boards, which comprises a first copper layer having a surface roughness suitable for adhering to a resin and being to become an electric circuit, a second copper layer having a sufficient strength as a metal layer as a whole and a coarser surface roughness than that of the first copper layer, and an intermediate layer formed between the first copper layer and the second copper layer, and made of a nickel-phosphorus alloy containing 1.1% by weight or more of phosphorus.

The present invention also provides a process for producing a metal foil for printed wiring boards, which comprises
a step of roughening a surface of a second copper layer having a sufficient strength as a metal layer,
a step of forming a nickel-phosphorus alloy layer containing 1.1% by weight or more of phosphorus on the roughened surface of the second copper layer, and
a step of forming a first copper layer on the nickel-phosphorus alloy layer, followed by roughening of the surface of the first copper layer finer than the second copper layer.

The present invention further provides a process for producing a printed wiring board using the metal foil obtained above.

BRIEF DESCRIPTION OF THE DRAWING

The attached drawing is a cross-sectional view of the metal foil for printed wiring boards of the present invention.

DESCRIPTION OF THE PREFERRED EMBODIMENTS

The metal foil for producing printed wiring boards of the present invention comprises a first copper layer having a surface roughness suitable for adhering to a resin and being to become an electric circuit, a second copper layer having a sufficient strength as a metal layer as a whole and a coarser surface roughness than that of the first copper layer, and an intermediate layer formed between the first copper layer and the second copper layer, and made of a nickel-phosphorus alloy containing 1.1% by weight or more of phosphorus.

Among the metal foil for printed wiring boards, the second copper layer (or carrier copper layer) should have a sufficient strength as a metal layer as a whole. The thickness of the second copper layer is preferably 10 to 150 μm. When the second copper layer is too thin, a sufficient strength as a metal layer as a whole cannot be attained. On the other hand, when the second copper layer is too thick, it requires undesirably a much time to remove the second copper layer by etching. Too thick second copper layer is uneconomical.

On the other hand, the first copper layer (or circuit-forming copper layer) which has a surface roughness suitable for adhering to a resin and finer than that of the second copper layer and is to become an electric circuit, preferable has a thickness of 1 to 15 μm. When the first copper layer is too thin, pin holes are easily formed in the formed first copper layer, resulting in causing many defects when formed into a circuit conductor. On the other hand, when the first copper layer is too thick, the side etching appeared in prior art techniques becomes great, resulting in making it difficult to attain a higher wiring density.

The intermediate layer is made of a nickelphosphorus alloy containing 1.1% by weight or more of phosphorus, preferably 1.1 to 6.5% by weight of phosphorus. When the phosphorus content is less than 1.1% by weight, the selective etching properties of intermediate layer after heat treatment of 300° C. or higher is undesirably lowered. On the other hand, when the phosphorus content is too much, the time necessary for removing by etching becomes longer and the underlying copper layer which is to become a circuit is undesirably damaged.

The metal foil of the present invention can be produced by roughening a surface of a second copper layer having a sufficient strength as a metal layer, forming a nickel-phosphorus alloy layer containing 1.1% by weight or more of phosphorus and having a thickness of preferably 0.04 to 1.5 μm on the roughened surface, and forming a first copper layer on the nickel-phosphorus alloy layer.

More concretely, a copper foil preferably having a thickness of 10 to 150 μm and having a sufficient strength as a metal layer and a surface roughness coarser than that of the first copper layer is used for forming the second copper layer. At least one surface of the copper foil is roughened with a larger roughness than the first copper layer. The step of producing the large roughness is a necessary step for producing a surface roughened first copper layer having both a large roughness and a small roughness as shown in the attached drawing, wherein numeral 1 denotes the second copper layer, numeral 2 the Ni-P alloy layer and numeral 3 the first copper layer. As a result, the surface area of the first copper layer can be made remarkably large and can be made suitable for adhering to a resin. On the roughened surface of the second copper layer, a nickel-phosphorus alloy layer with a thickness of preferably 0.04 to 1.5 μm is formed by electrolytic plating. On the nickel-phosphorus alloy layer, a first copper layer is formed by, for example, by electrolytic copper plating. When the thickness of the nickel-phosphorus alloy layer is less than 0.04 μm, heat resistance is undesirably lowered.

As mentioned above, at least one surface of the second copper layer is roughened preferably to a large roughness of about 5 to 20 μm. The formation of the roughened surface can be carried out by a conventional process, for example, by a process of contacting with a soft etching solution including a soft etching agent, a process of applying special conditions for electrolytic plating, etc.

Roughening with a finer roughness on the first copper layer than that of the second copper layer can be carried out using electroless plating, substituting plating, vapor deposition, etc., wherein conditions are adjusted so as to produce a roughened surface. For example, when the surface roughness of the second copper layer is about 10 to 15 μm, it is preferable that the surface roughness of the first copper layer is about 2 to 4 μm. It is also possible to use a mechanical polishing method such as blowing sandblast, and using a sander belt.

By roughening the second copper layer which is thick and used for supporting, forming the intermediate layer on the roughened surface of the second copper layer, and forming the first copper layer which is thin and becomes a circuit conductor, followed by roughening with finer surface roughness than that of the second copper layer, there can be obtained sufficiently good adhesive strength after adhering the resulting three-layered copper foil to a prepreg without damaging the first copper layer which is to become a circuit conductor.

Further, when the second copper layer (carrier copper layer) is removed by etching, and the intermediate layer is removed by etching, and the residual copper foil (first copper layer) is processed to form a circuit, the roughened shape is retained on the surface. When such a surface is covered with an insulating coating such as a solder resist, or a prepreg and a copper foil are piled thereon and lamination adhered thereto, the adhesive strength between the circuit conductor and the solder resist or the prepreg can be enhanced.

The thus roughened surface is preferably covered with a rust proof film so as to obtain storage stability for a long period of time. As the rust proof treatment, there can be used a process for forming a film with an imidazole organic compound, a chromate treatment, a zincate treatment, etc.

The thus produced metal foil can be used for producing printed wiring boards by various methods.

One example of a process for producing a printed wiring board using the metal foil mentioned above comprises:

(a) a step of piling a prepreg on a roughened first copper layer of a metal foil for printed circuit boards comprising a first copper layer having a surface roughness suitable for adhering to a resin and being to become an electric circuit, a second copper layer having a sufficient strength as a metal layer as a whole and a coarser surface roughness than that of the first copper layer, and a nickel-phosphorus alloy layer containing 1.1% by weight or more of phosphorus with preferably 0.04–1.5 μm thick formed between the first copper layer and the second copper layer, and if necessary further piling a copper foil, followed by pressing with heating to give an integral structure, (b) a step of removing only the second copper layer by etching, (c) step of removing only the nickel-phosphorus alloy layer by etching, and (d) a step of processing the first copper layer, or if necessary, the copper foil to give a circuit conductor.

As the prepreg, it is possible to use an uncured or semi-cured prepreg.

The uncured prepreg can be obtained by impregnating a resin such as a polyimide resin, an epoxy resin, a phenol resin, or a mixture thereof and a curing agent for such a resin into a reinforcing substrate such as glass cloth, glass mono-fiber, paper, etc. The semi-cured prepreg can be obtained by heating (B-stage) the uncured prepreg mentioned above.

As the prepreg, it is also possible to use that containing a thermoplastic resin such as a fluorine resin. In such a case, the steps of melting of the resin, fusion with the metal foil and cooling are carried out in this order without using a curing agent.

In the step (b) of removing only the second copper layer by etching, the second copper layer can be etched by contacting it with a chemical solution containing chlorine ions, ammonium ions and copper ions (hereinafter referred to as "an alkali etchant"). The term "contacting" means that the second copper layer is dipped in the alkali etchant or sprayed with the alkali etchant.

In the step (c) of removing only the nickel-phosphorus alloy layer by etching, the nickel-phosphorus alloy layer can be etched by contacting it with a chemical solution containing nitric acid, hydrogen peroxide, an organic acid having one or more carboxyl groups as a first additive and benzotriazole or a derivative thereof as a second additive.

The organic acid having one or more carboxyl groups used as a first additive preferably has an acid strength (Ka) of $10^{-3}$ to $10^{-5}$. Examples of the organic acid are formic acid, acetic acid, propionic acid, butyric acid, succinic acid, glutaric acid, lactic acid, malic acid, citric acid, tartaric acid, derivatives thereof such as metallic salts thereof, derivatives wherein a hydrogen atom attached to a carbon is substituted with an alkyl group, e.g. methyl malate, etc., carboxyl group-monoesterified derivatives such as monomethyl tartarate, monoethyl tartarate, etc., monoanilide derivatives, e.g. tartaric acid monoanilide, etc.

As the derivatives of benzotriazole, there can be used 1-oxybenzotriazole, 1-N-benzoyl-benzotriazole, 1-N-acetylbenzotriazole, 5-benzotriazole carboxylic acid, 1-hydroxybenzotriazole, 5-methylbenzotriazole, etc.

As mentioned above, the major components of the etching solution are nitric acid and hydrogen peroxide. When only nitric acid and hydrogen peroxide are used in the etching solution, dissolution of the nickel in the nickel-phosphorus alloy seems to proceed by the following reactions:

$$3Ni + 2HNO_3 \rightarrow 3NiO + H_2O + 2NO \uparrow$$

$$Ni + H_2O_2 \rightarrow NiO + H_2O$$

$$NiO + 2HNO_3 \rightarrow Ni(NO_3)_2 + H_2O$$

In the same manner, copper seems to be dissolved by the following reactions:

$$3Cu + 2HNO_3 \rightarrow 3CuO + H_2O + 2NO \uparrow$$

$$Cu + H_2O_2 \rightarrow CuO + H_2O$$

$$CuO + 2HNO_3 \rightarrow Cu(NO_3)_2 + H_2O$$

The nitric acid is used for maintaining the acidity necessary for peeling nickel. The amount of nitric acid is preferably 100 to 300 g/liter. When the amount is less than 100 g/liter, the peeling action becomes weak. On the other hand, when the amount is more than 300 g/liter, the acidity becomes so strong that excessive etching often takes place in the case of using a copper layer as a substrate.

The hydrogen peroxide functions as an oxidizing agent to oxidize the nickel and to accelerating the peeling of nickel. The hydrogen peroxide is preferably used in an amount of 5 to 20 ml/liter. When the amount is less than 5 ml/liter, the effect as an oxidizing agent becomes insufficient. On the other hand, when the amount is more than 20 ml/liter, the copper layer used as a substrate is often etched excessively due to too strong oxidizing activity.

The organic acid used as the first additive functions for controlling sufficiently dissolution of copper substrate when the nickel-phosphorus alloy layer is peeled. It is preferably used in an amount of 10 to 200 g/liter in the etching solution. When the amount is less than 10 g/liter, the effect for inhibiting corrosion of the substrate copper layer becomes small. On the other hand, when the amount is more than 200 g/liter, the effect is not improved as expected, resulting in becoming uneconomical in practical use.

Benzotriazole and derivatives thereof used as the second additive is preferably used in an amount of preferably 1 to 10 g/liter. When the amount is less than 1 g/liter, the effect for inhibiting corrosion of substrate copper layer becomes small. On the other hand, when the amount is more than 10 g/liter, the improvement of the effect cannot be expected and thus uneconomical practically.

In the step (d) of processing the first copper layer, or if necessary, the copper foil to give a circuit conductor, the processing can be carried out by forming an etching resist on the first copper layer or the copper foil and removing unnecessary copper by etching.

Further, when two or more circuit layers are connected by through-holes, holes are drilled, for example, after the step (a) or the step (b), at least the inner walls of the holes are metallized after the step (c), and then an etching resist mentioned above is formed, followed by removing unnecessary copper by etching.

Another example of a process for producing a printed wiring board using the metal foil mentioned above comprises: '(a')' a step of forming a resin layer on a roughened first copper layer of a metal foil for printed circuit boards comprising a first copper layer having a surface roughness suitable for adhering to a resin and being to become an electric circuit, a second copper layer having a sufficient strength as a metal layer as a whole and a surface roughness coarser than that of the first copper layer, and an intermediate layer formed between the first copper layer and the second copper layer and made of a nickel-phosphorus alloy containing 1.1% by weight or more of phosphorus, followed by heating, (b) a step of removing only the second copper layer by etching, (c) a step of removing only the nickel-phosphorus alloy layer by etching, and (d) a step of processing the first copper layer to give a circuit conductor.

In the step (a'), the formation of the resin layer can be carried out by coating a mixture of uncured resin and a curing agent, followed by heating for curing. Examples of the uncured resin are heat resistant thermosetting resins such as a polyimide resin, a polyamide resin, a polyamideimide resin, etc. As the curing agent, there can be used conventional ones used for such resins mentioned above.

The resin layer can also be a thermoplastic sheet. As the thermoplastic resin, a heat resistant fluorine resin can be used. It is also possible to employ the same steps of melting of the resin, fusion with the metal foil and cooling as used in the case of using the prepreg mentioned above.

The rest of the steps can be carried out as mentioned above.

The present inventors has studied commercially available composite metal layers and found the following points.

(1) In a step of laminating a prepreg including a thermosetting resin by applying heat and pressure, a step of curing the thermosetting resin with heating, a step of laminating a thermoplastic resin by applying heat and pressure for melting and fusing, or a step of fusing a thermoplastic resin with heating, an intermediate layer and a copper layer of commercially available composite metal layers are metallized, resulting in subjecting not only the supporting copper foil but also the intermediate layer to etching when a commercially available etching solution is used.

(2) There often takes place a stain called "smut" by an etching solution. This seems to be caused by impurities in nickel and copper or by reaction of nickel and etchant for the intermediate layer, said impurities being retained on a surface in a dark color without being etched. When the smut is produced, etching of the next copper layer for obtaining circuits cannot be carried out, resulting in causing short circuit.

(3) As the etching solution not producing the smut, there can be used a chemical solution comprising nitric acid, hydrogen peroxide, an organic acid containing one or more carboxyl groups and benzotriazole. But depending on the kind of the intermediate layer, only the intermediate layer sometimes cannot be selectively be dissolved by this etching solution.

In order to prevent the metallization and to etch only the intermediate layer selectively for removing, the present inventors have found that the use of nickel-phosphorus alloy as the metal of the intermediate layer is most suitable. Further, the effect of the nickel-phosphorus alloy intermediate layer can be exhibited when the thickness is preferably between 0.04 to 1.5 μm.

By using the nickel-phosphorus alloy as the intermediate layer, the problem of dissolution of the nickel intermediate layer with a commercially available etching solution comprising ethylenediamine, sodium hydroxide and m-nitrobenzenesulfonic acid is solved surprisingly. Further, no smut is found when the nickel-phosphorus alloy is used.

The present invention is illustrated by way of the following Examples, in which all percents are by weight unless otherwise specified.

Example 1

Using a copper sulfate plating solution, a second copper layer was formed on a stainless steel plate by electrolytic plating. The resulting plated layer thickness was about 30 μm and had an average surface roughness of 7 μm.

On the second copper layer, an intermediate layer was formed by electrolytic nickel-phosphorus plating using the following nickel-phosphorus plating solution under the conditions of 1.5 A/dm$^2$, at the liquid temperature of 50° C. and plating time of 5 minutes. As a result, the thickness of the plated film was about 0.2 μm when measured by using a fluorescent X-ray film thickness measuring device.

| (Composition) | $NiSO_4.6H_2O$ | 300 g/l. |
|---|---|---|
| | $NiCl_2.6H_2O$ | 50 g/l. |
| | $H_3BO_3$ | 40 g/l. |
| | Phosphorous acid | 10 g/l. |

On the thus deposited Ni-P alloy (P content: 3.8%) layer, a first copper layer was formed by electrolytic copper plating using a copper sulfate plating solution. As a result, particular deposition having particle size of about 1 to 2 μm was obtained with the thickness of about 2 μm.

Finally, a rust proof film of zinc.chromium was formed on the first copper layer by electrolytic treatment.

Then, a glass-expoxy resin prepreg was piled on the rust proof film and pressed with heating to give an integral laminate.

The second copper layer initially formed was removed until the Ni-P alloy layer was exposed using an alkali etchant.

Then, the exposed Ni-P alloy layer was removed until the first copper layer formed in the last stage was exposed using the etching solution having the following composition.

| (Composition of etching solution) | |
|---|---|
| Nitric acid | 200 g/l. |
| Hydrogen peroxide | 10 ml/l. |
| Propionic acid | 100 g/l. |
| Benzotriazole | 5 g/l. |

Example 2

The process of Example 1 was repeated except for making the thickness of the second copper layer 120 μm.

Example 3

The process of Example 1 was repeated except for making the thickness of the first copper layer 15 μm.

Example 4

The process of Example 1 was repeated except for forming the intermediate layer using the following electroless plating nickel-phosphorus plating solution at the liquid temperature of 80° C. for plating time of 1 minute. The thickness of the intermediate layer was about 0.2 μm when measured by using a fluorescent X-ray film thickness measuring device.

| (Composition) | $NiCl_2.6H_2O$ | 30 g/l. |
|---|---|---|
| | $CH_3COOH$ | 10 g/l. |
| | $NaH_2PO_2.6H_2O$ | 10 g/l. |
| | HCl | making the composition pH 5 |

Example 5

The process of Example 1 was repeated except for making the thickness of the intermediate layer 0.04 μm.

Comparative Example 1

The process of Example 1 was repeated except for forming the intermediate layer using the following nickel-iron plating solution:

| (Composition) | Nickel sulfate | 100 g/l. |
|---|---|---|
| | Nickel chloride | 100 g/l. |
| | Boric acid | 55 g/l. |
| | Ferrous sulfate | 58 g/l. |

Comparative Example 2

The process of Example 1 was repeated except for forming the intermediate layer using the following nickel plating solution:

| (Composition) | $NiSO_4.6H_2O$ | 300 g/l. |
|---|---|---|
| | $NiCl_2.6H_2O$ | 30 g/l. |
| | $H_3BO_3$ | 40 g/l. |

Comparative Example 3

The process of Example 1 was repeated except for forming the intermediate layer using the following nickel-tin plating solution:

| (Composition) | Stannous chloride | 50 g/l. |
|---|---|---|
| | $NiCl_2.6H_2O$ | 300 g/l. |
| | Ammonium hydrogen fluoride | 65 g/l. |

Comparative Example 4

The process of Example 1 was repeated except for forming the intermediate layer using the following lead plating solution:

| (Composition) | Lead borofluoride | 200 g/l. |
|---|---|---|
| | Borofluoric acid | 20 g/l. |
| | Boric acid | 14 g/l. |

Comparative Example 5

The process of Example 1 was repeated except for forming the intermediate layer using the following lead-tin plating solution:

| (Composition) | Stannous borofluoride | 130 g/l. |
|---|---|---|
| | Lead borofluoride | 50 g/l. |
| | Borofluoric acid | 125 g/l. |
| | Boric acid | 25 g/l. |
| | Peptone | 5 g/l. |

Comparative Example 6

The process of Example 1 was repeated except for forming the intermediate layer using the following tin plating solution:

| (Composition) | Tin sulfate | 73 g/l. |
|---|---|---|
| | Sulfuric acid | 50 g/l. |
| | Phenol sulfonic acid | 40 g/l. |
| | Gelatine | 2 g/l. |
| | β-Naphthol | 1 g/l. |

Comparative Example 7

A laminate was produced by piling the same prepreg as used in Example 1 on a copper foil of 5 μm thick bonded to aluminum carrier and presses with heating under the same conditions as in Example 1. Then, the aluminum was removed, followed by electrolytic copper plating so as to make the copper foil thickness 35 μm.

Comparative Example 8

The process of Example 1 was repeated except for using an electroless nickel-boron plating solution including a boron reducing agent [Blue Shumer SB-55, a trade name, mfd. by Japan Kanizen Co., Ltd.] in place of the electrolytic nickel-phosphorus plating solution.

Comparative Example 9

The process of Example 1 was repeated except for making the thickness of the nickel-phosphorus layer 0.02 μm in place of about 0.2 μm.

The laminates obtained in Examples 1 to 5 and Comparative Examples 1 to 9 were treated for tests and subjected to tests of the heat resistance of intermediate layer, the selective etching properties, the stability of plating solution, and the adhesive strength as follows:

(1) Preparation of test piece

A plating resist was formed on a laminate so as to expose only the desired circuit conductor portions. On the exposed portion from the resist, a copper layer of 30 μm thick was formed by electrolytic plating as mentioned previously. Then, solder plating of 8 μm thick was deposited, followed by removal of the plating resist by peeling so as to expose the copper layer covered by the plating resist. Then, etching was carried out so as to remove the exposed copper layer using an alkali etchant. As a result, a copper layer in the form of a circuit conductor was formed. The shape of it was a pattern for the tests in the form of a rectangle of 10 mm wide and 100 mm long.

(2) Selective etching properties of second copper layer after heat treatment

Test pieces were subjected to heat treatment at 200° C., 300° C., 400° C., 500° C., or 600° C. for about 30 minutes, or not treated, under nitrogen atmosphere, followed by removal of a second copper layer using an alkali etchant.

Evaluation was as follows:

| | Evaluation was as follows: |
|---|---|
| ○ | Only the second copper layer was etched selectively. |
| Δ | A part of intermediate layer was etched to form pin hole-like surface. |
| x | The second copper layer including the intermediate layer was removed by etching. |

(3) Selective etching properties of intermediate layer

After removing a second copper layer by etching, an intermediate layer was also removed by etching using the etching solution for removing an intermediate layer used in Example 1. Then, the surface of the resulting copper foil was observed.

Evaluation was as follows.

| | Evaluation was as follows. |
|---|---|
| ○ | Only the intermediate layer was selectively etched. |
| Δ | The intermediate layer was selectively etched but it took a very long period of time. |
| x | Etching was impossible. |

(4) Stability of plating solution

A plating solution used for forming an intermediate layer was allowed to stand for a long period of time to observe generation of decomposition, precipitation, etc.
Evaluation: ○ good, × poor.

(5) Adhesive strength

After removing a second copper layer by etching and removing an intermediate layer by etching, plating was carried out so as to make the thickness of copper foil 35 μm. The resulting sample was subjected to a peeling test. The tensile strength of a copper clad laminate obtained by bonding two ordinary copper foils of 35 μm thick was 1.6 to 1.8 kgf/cm².

The test results of (2) to (4) are listed in Table 1.

TABLE 1

| | | Example | | | | | Comparative Example | | | | | | | | |
|---|---|---|---|---|---|---|---|---|---|---|---|---|---|---|---|
| | | 1 | 2 | 3 | 4 | 5 | 1 | 2 | 3 | 4 | 5 | 6 | 7 | 8 | 9 |
| Selective etching properties of second copper layer after heat treatment | No treatment | ○ | ○ | ○ | ○ | ○ | x | ○ | ○ | x | x | ○ | — | ○ | x |
| | 200° C. | ○ | ○ | ○ | ○ | ○ | x | ○ | ○ | x | x | ○ | — | ○ | x |
| | 300° C. | ○ | ○ | ○ | ○ | ○ | x | x | x | x | x | ○ | — | ○ | x |
| | 400° C. | ○ | ○ | ○ | ○ | ○ | x | x | x | x | x | x | — | x | x |
| | 500° C. | ○ | ○ | ○ | ○ | ○ | x | x | x | x | x | x | — | x | x |
| | 600° C. | x | x | x | ○ | x | x | x | x | x | x | x | — | x | x |
| Selective etching | | ○ | ○ | ○ | ○ | ○ | ○ | ○ | x | ○ | ○ | Δ | ○ | ○ | ○ |

TABLE 1-continued

| | Example | | | | | Comparative Example | | | | | | | | |
|---|---|---|---|---|---|---|---|---|---|---|---|---|---|---|
| | 1 | 2 | 3 | 4 | 5 | 1 | 2 | 3 | 4 | 5 | 6 | 7 | 8 | 9 |
| properties of intermediate layer | | | | | | | | | | | | | | |
| Stability of plating solution | ○ | ○ | ○ | ○ | ○ | x | ○ | ○ | ○ | ○ | x | ○ | ○ | ○ |
| kind of intermediate layer | NiP | NiP | NiP | NiP | NiP | NiFe | Ni | NiSn | Pb | PbSn | Sn | Al | NiB | NiP ** |
| Smut* | ○ | ○ | ○ | ○ | ○ | x | x | ○ | x | ○ | ○ | — | ○ | ○ |

Note)
*: ○: No smut
x: Smut occurred
**: Thickness of NiP was 0.02 μm

Examples 6 to 13

The process of Example 1 was repeated except for changing the phosphorus content in the nickel-phosphorus alloy as shown in Table 2.

The phosphorus content was measured by weighing a sample, burning the sample to measure a generating amount of spectrum of phosphorus, reading out the weight of phosphorus from a calibration curve previously prepared, and calculating the content of phosphorus in the sample.

As a sample containing no phosphorus, that used in Comparative Example 2 was used.

Influences of the etching solution at the time of removal of an intermediate (nickel-phosphorus) layer were also evaluated. The mark ○ means that there was no influence on the first copper layer. The mark Δ means that the first copper layer was slightly etched. The mark × means that the first copper layer was also etched.

Selective etching properties of second copper layer was also tested after heat treatment at 300° C.

The results are also shown in Table 2.

In Comparative Example 2, since the intermediate layer (containing only Ni) was also etched, no measurement was possible as it was. For reference, the datum that a nickel plating layer of 0.2 μm thick was etched for about 2.5 minutes was listed in Table 2 with the mark "(2.5)*".

TABLE 2

| Example No. | Phosphorus content (%) | Etching time (min) | Influence on first copper layer | Selective etching properties |
|---|---|---|---|---|
| Comparative Example 2 | 0 | (2.5)* | Δ | x |
| Example 6 | 1.1 | 1.3 | ○ | ○ |
| 7 | 1.5 | 1.0 | ○ | ○ |
| 8 | 2.3 | 2.5 | ○ | ○ |
| 9 | 3.8 | 4.0 | ○ | ○ |
| 10 | 4.3 | 6.0 | ○ | ○ |
| 11 | 5.1 | 6.5 | ○ | ○ |
| 12 | 6.5 | 9.0 | ○ | ○ |
| 13 | 9.1 | 20 | Δ | ○ |

Examples 14 to 17

Peeling test of an intermediate (Ni-P) layer was carried out using the following aqueous etching solutions.

| (Etching solution) | | |
|---|---|---|
| (Example 14) | nitric acid | 200 g/liter |
| | hydrogen peroxide | 10 ml/liter |
| | acetic acid | 100 g/liter |
| | benzotriazole | 5 g/liter |
| (Example 15) | nitric acid | 300 g/liter |
| | hydrogen peroxide | 10 ml/liter |
| | propionic acid | 100 g/liter |
| | benzotriazole | 5 g/liter |
| (Example 16) | nitric acid | 200 g/liter |
| | hydrogen peroxide | 20 ml/liter |
| | glutaric acid | 100 g/liter |
| | 5-methylbenzotriazole | 5 g/liter |
| (Example 17) | nitric acid | 200 g/liter |
| | hydrogen peroxide | 10 ml/liter |
| | propionic acid | 100 g/liter |
| | 1-hydroxybenzotriazole | 10 g/liter |

A sample was prepared by forming a nickel-phosphorus alloy plating layer (P content: 3.8%) of about 0.2 μm thick on a copper layer of copper-clad epoxy laminate of 20 μmm wide and 60 mm long, or forming a nickel-copper plating layer of about 0.2 μm on a resin substrate, followed by forming copper conductor wiring.

The nickel-phosphorus plating layer was formed by using the following plating solution under the following plating conditions.

| [Composition of plating solution] | |
|---|---|
| nickel sulfate | 240 g/liter |
| nickel chloride | 45 g/liter |
| boric acid | 30 g/liter |
| phosphorous acid | 5 g/liter |
| [Plating conditions] | |
| temperature | 35° C. |
| current density | 1.5 A/dm$^2$ |
| time | 4 minutes |

The film thickness of a nickel-phosphorus alloy layer was measured by using a fluorescent X-rays film thickness meter SFT-8000 (a trade name, mfd. by Seiko Electronic Co., Ltd.).

Each sample was immersed in 100 ml of an etching solution at 50° C. to measure peeling of a nickel-phosphorus alloy layer and a decrease in the thickness of first copper layer.

As a result, no smut was formed and only the intermediate layers are removed without damaging the first copper layers in Examples 14 to 17.

Comparative Example 10

The process of Example 14 was repeated except for using a sample obtained in Comparative Example 3.

As a result, the intermediate layer was not removed at all.

Comparative Example 11

The process of Example 15 was repeated except for using a sample obtained in Comparative Example 6.

As a result, the intermediate layer was not removed at all.

Comparative Example 12

Samples obtained in Examples 14 to 17 were treated with the following etching solution:

| Merstrip N-950A ($H_2SO_4$ 16% $HNO_3$ 11%, containing N and P) | 500 ml/liter |
| --- | --- |
| Merstrip N-950B (containing N) | 100 ml/liter |
| Aqueous hydrogen peroxide solution | 100 ml/liter |

As a result, there appeared smut.

Comparative Example 13

Samples obtained in Examples 14 to 17 were treated with an etching solution comprising 170 g/liter of sulfuric acid and 56 g/liter of m-nitrobenzenesulfonic acid at 50° C. for 30 minutes.

As a result, the intermediate layers were not removed at all.

Example 18

A second copper layer was formed on a stainless steel plate by electrolytic copper plating using a copper sulfate plating solution. As a result, there was obtained the plating thickness of about 30 $\mu$m and average surface roughness of deposited copper of 7 $\mu$m.

On the second copper layer, an intermediate layer was formed by electrolytic nickel-phosphorus plating using the following nickel-phosphorus plating solution under conditions of 0.7 A/dm$^2$, liquid temperature of 50° C. and plating time of 8 minutes. As a result, the plating thickness was about 1.0 $\mu$m.

| (Composition) | $NiSO_4 6H_2O$ | 300 g/l. |
| --- | --- | --- |
| | $NiCl_2.6H_2O$ | 50 g/l. |
| | $H_3BO_3$ | 40 g/l. |
| | Phosphorous acid | 10 g/l. |

On the deposited nickel-phosphorus layer, a first copper layer was formed by electrolytic copper plating using a copper sulfate plating solution. As a result, particular deposition having a particle size of about 1 to 2 $\mu$m was obtained and the plating thickness was about 2 $\mu$m.

Finally, on the first copper layer a rust proof film of zinc chromium was formed by electrolytic treatment.

Using two metal foils thus produced, a laminate was prepared by sandwiching a semi-cured thermosetting (epoxy) resin prepreg E-67 (a trade name, mfd. by Hitachi Chemical Co., Ltd.) so as to contact roughened first copper layers with the prepreg, and pressing at 30 kgf/m$^2$ with heating at 170°C.

Only two second copper layers on the both sides were removed by etching using an etching solution for A Process (a trade name, mfd. by Soltex Co., Ltd.) which is an alkali etching solution, followed by removal of only the nickel-phosphorus alloy layers on both sides by etching using the same etching solution as used in Example 1. Holes were drilled and inner walls of the holes and the first copper layers on both sides were subjected to electroless plating using a CC-41 plating solution (a trade name, mfd. by Hitachi Chemical Co., Ltd.) to form a plating layer of 5 $\mu$m thick on the whole surfaces. Further, electrolytic plating was carried out using a pyrophosphoric acid copper plating bath to form a copper layer of 25 $\mu$m thick, followed by formation of an etching resist and processing for obtaining circuit conductors.

Example 19

On the roughened surface of first copper layer of metal foil prepared in Example 18, a semi-cured epoxy resin prepreg E-67 (a trade name, mfd. by Hitachi Chemical Co., Ltd.) was piled, and a copper foil of 35 $\mu$m thick was further piled on the prepreg, followed by pressing at 30 kgf/cm$^2$ with heating at 170° C. to give an integral laminate.

Then, only the second copper layer of the resulting laminate was removed by etching using the A Process etching solution as used in Example 6, followed by removal of only the nickel-phosphorus alloy layer by etching using the same etching solution as used in Example 1. Holes were drilled and inner walls of the holes and the first copper layer and the later adhered copper foil surface of the laminate were subjected to electroless plating using a CC-41 plating solution to form a plating layer of 5 $\mu$m thick on the whole surfaces. Further, electrolytic plating was carried out using a pyrophosphoric acid copper plating bath to form a copper layer of 25 $\mu$m thick, followed by formation of an etching resist and processing for obtaining circuit conductors.

Example 20

A prepreg containing polytetrafluoroethylene, which is a thermoplastic fluorine resin, was sandwiched by two metal foils obtained in Example 18 so as to contact each roughened first copper layer with the prepreg and pressed at 20 kgf/cm$^2$ with heating at 385° C. to form an integral laminate. Then, only the second copper layers on both sides were removed by etching, followed by removal of the nickel-phosphorus layers on both sides by etching. Holes were drilled and inner walls of the holes, the first copper layers on both sides were subjected to electroless plating using a CC-41 plating solution to form a plating layer of 5 $\mu$m thick on the whole surfaces. Further, electrolytic plating was carried out using a pyrophosphoric acid copper plating bath to form a copper layer of 25 $\mu$m thick, followed by formation of an etching resist and processing for obtaining circuit conductors.

Example 21

A rolled copper foil of 35 $\mu$m was used as the second copper layer, which was roughened on the surfaces by soft etching using ammonium persulfate. The average surface roughness of the rolled copper foil was 10 $\mu$m.

Then, the intermediate layer was formed on the rolled copper foil by electrolytic nickel-phosphorus plating using the following nickel-phosphorus plating solution under the conditions of 1.5 A/dm², liquid temperature of 50° C. and plating time of 10 minutes.

| (Composition) | $NiSO_4.6H_2O$ | 300 g/l. |
| --- | --- | --- |
| | $NiSO_2.6H_2O$ | 50 g/l. |
| | $H_3BO_3$ | 40 g/l. |
| | Phosphorous acid | 10 g/l. |

The thickness of the plated layer was about 0.5 μm.

On the deposited nickel-phosphorus layer, the first copper layer was formed by electrolytic copper plating using a copper sulfate plating solution. As a result, particular deposition having a particle size of about 1-2 μm and a thickness of about 2 μm was obtained. Then, an oxide film was formed by oxidizing the surface of the first copper layer using an oxidizing agent. The oxidation treatment was carried out by using an alkali aqueous solution containing chlorous acid salt as the oxidizing agent. A part of the oxidized film was reduced to metallic copper by contacting with a reducing agent of dimethylamine borane.

The thus produced two metal foils were laminated by directly coating a poly(amic acid) varnish on roughened first copper layers, followed by curing with heating at 400° C. Then, only the second copper layers were removed by etching, followed by removal of only the nickel-phosphorus alloy layers by etching using the same etching solution as used in Example 1. Holes were drilled and inner walls of the holes and surfaces of the first copper layers were subjected to electroless plating using a CC-41 plating solution to form a plating layer of 5 μm thick on the whole surfaces. Further, electrolytic plating was carried out using a pyrophosphoric acid copper bath to form a copper layer of 25 μm thick, followed by formation of an etching resist and processing for obtaining circuit conductors.

Example 22

A polytetrafluoroethylene sheet film, which is a thermoplastic fluorine resin, was sanddwiched by the two metal foils obtained in Example 21 so as to contact with the roughened first copper layers, followed by pressing at 20 kgf/cm² at 385° C. to form a laminate. Only the second copper layers were removed by etching, followed by removal of only the nickel-phosphorus alloy layers by etching. After forming etching resists, circuit conductors were processed.

The wiring boards thus produced were able to have the wiring density as high as circuit width of 0.15 mm.

The peeling strength of individual wiring boards was about 1.8 kgf/cm².

As explained above, the present invention can provide the metal foil for printed using boards excellent in wiring density, and heat resistance, and also heat resistance during production procedures, and a process for producing the same. By using this metal foil, printed wiring boards can be produced simply with high efficiency. Further, insulating substrates wherein heat resistance is not required, can be used together with the metal foil of the present invention to produce printed wiring boards simply and efficiently.

What is claimed is:

1. A metal foil for printed wiring boards, which comprises a first copper layer having a surface roughness suitable for adhering to a resin and providing an electric circuit, a second copper layer having a sufficient strength as a metal layer as a whole and a coarser surface roughness than that of the first copper layer, and an intermediate layer formed between the first copper layer and the second copper layer and made of a nickel-phosphorus alloy containing 1.1% by weight or more of phosphorus.

2. A metal foil according to claim 1, wherein the intermediate layer has a thickness of 0.04 to 1.5 μm.

3. A metal foil according to claim 2, wherein the first copper layer has a thickness of 1 to 15 μm.

4. A metal foil according to claim 3, wherein the second copper layer has a thickness of 10 to 150 μm.

5. A metal foil according to claim 4, wherein the nickel-phosphorus alloy contains 1.1 to 6.5% by weight of phosphorus.

6. A metal foil according to claim 1, which further comprises a rust proof film formed on at least one side of the first copper layer and/or the second copper layer which is exposed to air.

7. A metal foil according to claim 6, wherein the rust proof film comprises a film of an imidazole organic compound, a chromate or a zincate.

8. A metal foil according to claim 1, wherein the nickel-phosphorus alloy contains 1.1 to 6.5% by weight of phosphorus.

9. A metal foil according to claim 1, wherein the intermediate layer is formed by electrolytic plating the nickel-phosphorus alloy on the roughened surface of the second copper layer.

10. A metal foil according to claim 1, wherein the surface roughness of the first copper layer is about 2 to 4 μm and the surface roughness of the second layer is about 5 to 20 μm.

* * * * *